United States Patent [19]

Mukai et al.

[11] 4,365,264

[45] Dec. 21, 1982

[54] SEMICONDUCTOR DEVICE WITH HIGH DENSITY LOW TEMPERATURE DEPOSITED $SI_wN_xH_yO_z$ PASSIVATING LAYER

[75] Inventors: Kiichiro Mukai; Seiki Harada; Shin-ichi Muramatsu, all of Hachioji; Atsushi Hiraiwa, Kokubunji; Shigeru Takahashi, Hachioji; Katsuhisa Usami, Hinodemachi; Seiichi Iwata, Sayama; Satoru Ito, Hinodemachi; Takeo Yoshimi, Kokubunji, all of Japan

[73] Assignee: Hitachi, Ltd., Tokyo, Japan

[21] Appl. No.: 265,167

[22] Filed: May 19, 1981

Related U.S. Application Data

[63] Continuation of Ser. No. 62,118, Jul. 30, 1979, abandoned.

[30] Foreign Application Priority Data

Jul. 31, 1978 [JP] Japan .................................. 53-92633

[51] Int. Cl.³ .......................................... H01L 29/34
[52] U.S. Cl. ...................................... 357/54; 357/52; 357/59; 357/73

[58] Field of Search ....................... 357/52, 54, 59, 73

[56] References Cited

U.S. PATENT DOCUMENTS

| 4,001,870 | 1/1977 | Saiki et al. | 357/54 |
| 4,040,083 | 8/1977 | Saiki et al. | 357/54 |
| 4,091,406 | 5/1978 | Lewis | 357/54 |
| 4,091,407 | 5/1978 | Williams et al. | 357/54 |
| 4,097,889 | 6/1978 | Kern et al. | 357/54 |

OTHER PUBLICATIONS

W. Kern et al., "Advances in Deposition Processes for Passivation Films," J. of Vacuum Sci. and Tech., vol. 14, #5, Sep./Oct. 1977, pp. 1082-1099.

*Primary Examiner*—Joseph E. Clawson, Jr.
*Attorney, Agent, or Firm*—Antonelli, Terry & Wands

[57] ABSTRACT

A semiconductor device has a passivation layer disposed on a semiconductor body having at least one circuit element therein. This layer is made of a silicon nitride material containing 0.8-5.9 weight-% of H, together with 61-70 weight-% of Si, 25-37 weight-% of N and up to 0.6 weight-% of O and has a density of 2.9-3.05 gr/cm³.

5 Claims, 10 Drawing Figures

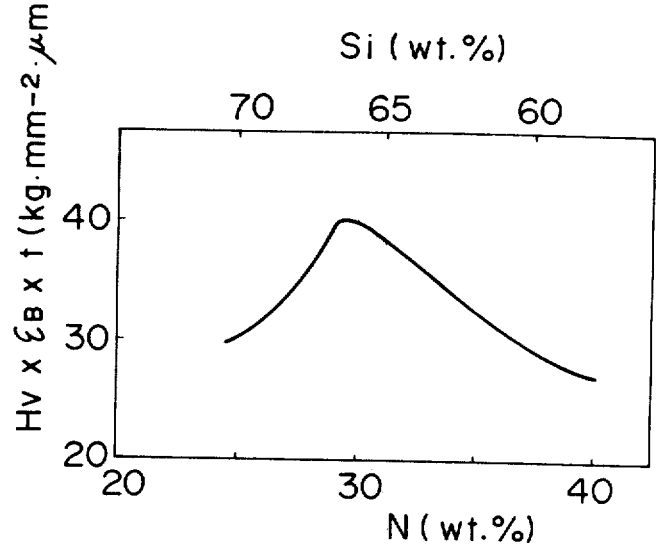
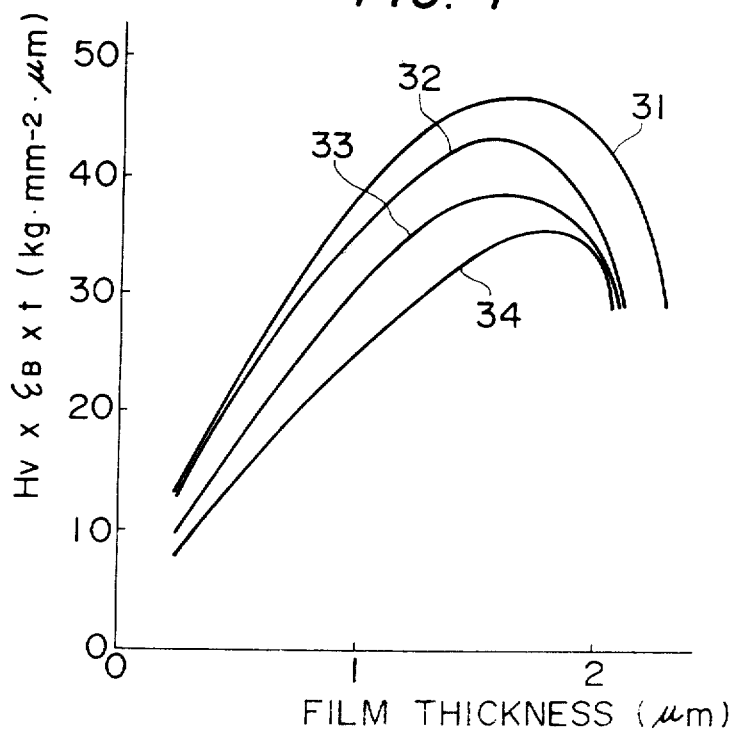

SEMICONDUCTOR DEVICE WITH HIGH DENSITY LOW TEMPERATURE DEPOSITED $SI_wN_xH_yO_z$ PASSIVATING LAYER

BACKGROUND OF THE INVENTION

1. Field of the Invention

This invention relates to a semiconductor device of high reliability. More particularly, it relates to a semiconductor device which comprises a passivation layer of high performance made of a silicon nitride material.

2. Brief Description of the Prior Art

Semiconductor devices of which high reliabilities are required, especially ICs and LSIs for telecommunications to be used in computers, etc. and for industries to be used in car electronics, etc. have heretofore been mainly sealed in ceramic packages. Since, however, the ceramic packages are expensive, the use of inexpensive plastic packages (resin-molded) has recently been contrived. This is because the automation of operations and the batch assembly are easily carried forward and also because a resin forming the material of the plastic package is cheaper.

The resin used for the plastic package, however, often contains impurity ions therein and is also unsatisfactory in point of airtightness in such a manner that moisture in the outside penetrates therethrough. The device within the plastic package is, therefore, liable to undergo variations in characteristics, corrosion of Al interconnections, etc. In order to compensate for these disadvantages of the resin material and to maintain the high reliability of the device, an excellent passivation layer needs to be disposed on the semiconductor body. The passivation layer in this case is required to be free from defects such as pinholes and cracks and to be excellent in the ability to stop the moisture as well as the impurity ions.

Heretofore, a phosphosilicate glass film and a silicon dioxide film have chiefly been employed as the passivation layers of LSIs etc. These films, however, are low in mechanical strength, so that when the semiconductor devices are sealed into the plastic packages, cracks appear in the passivation layer films due to compressive stresses at the hardening of the resin. The appearance of the cracks in the passivation layer is unfavorable because the impurity ions contained in the sealing resin and the moisture which penetrates through the sealing resin intrude into circuit elements of the device through the cracks to give rise to the degradation of the characteristics of the device and the breaking of the interconnections due to corrosion, resulting in lowering the reliability of the device.

The following references are cited to show the state of the art:

(i) Japanese Patent Application Laying-open No. 56973/1978
(ii) Japanese Patent Application Publication No. 21017/1969
(iii) P. H. Holloway and H. J. Stein: *Journal of Electrochemical Society*, vol. 123, No. 5 (May 1976), pages 723-728.

SUMMARY OF THE INVENTION

This invention has for its object to eliminate the difficulty of the prior art and to provide a semiconductor device comprising a passivation layer of high performance.

In order to accomplish this object, a semiconductor device according to this invention comprises a passivation layer made of a silicon nitride material containing 0.8-5.9 weight-% of hydrogen (H), which is chemically combined, on a semiconductor body which has at least one circuit element therein.

The film of silicon nitride material has a power of stopping moisture as well as impurity ions and has very few pinholes. By appropriately selecting the composition, a film which has few defects such as cracks and which exhibits excellent mechanical characteristics is obtained.

The silicon nitride material which constitutes the passivation layer needs to contain 0.8-5.9 weight-% of H (hydrogen). In case where the content of H is greater than 5.9 weight-%, unfavorably $H_2$-gas is emitted at a temperature rise in a process after the formation of the passivation layer, to suddenly cause bulges and cracks in the passivation layer. When the content of H is less than 0.8 weight-%, unfavorably the silicon nitride material film formed has a high tensile stress in the form of an internal stress, and the film cracks when deposited to a thickness of 0.3-0.7 μm or greater.

It is desirable that the silicon nitride material constituting the passivation layer contains 61-70 weight-% of Si, 25-37 weight-% of N, 0.8-5.9 weight-% of H, combined chemically, and at most 0.6 weight-% of O, combined chemically, as its main constituents. When the contents of Si and N lie outside these composition ranges, unfavorably the film formed of the silicon nitride material is liable to have cracks due to external stresses, and it is highly probable that cracks will appear due to compressive stresses of resin at the time when the semiconductor device is sealed into a plastic package. In case where the content of O exceeds 0.6 weight-%, unfavorably the silicon nitride material film formed exhibits inferior mechanical characteristics and is similarly liable to cracks due to external stresses. More preferably ranges of the Si content and the N content are 63-68.5 weight-% and 27-34 weight-%, and the most preferable ranges are 64-67.5 weight-% and 28-32 weight-%, respectively.

As processes for forming the silicon nitride material film, there are considered the conventional CVD (chemical vapor deposition) and the plasma CVD (plasma-enhanced chemical vapor deposition). With the conventional CVD, however, the substrate must be heated to 600-1,000° C. It can, therefore, be said that the process is, in general, unsuitable for the formation of the passivation layer which is often disposed on an interconnecting conductor layer of Al. The plasma CVD is accordingly suitable as the process for forming the silicon nitride material film to be adopted in this invention. According to the plasma CVD, the film of silicon nitride material can be formed even at low substrate temperatures of 450° C. and below. The technique of depositing silicon nitride with the plasma CVD is well known in the field of semiconductor industries. As apparent from the above description, the "silicon nitride material" herein referred to is not a compound having a single composition, but it is an amorphous material lying within the specified range of compositions which consist principally of Si and N.

Further, the density is an important property of the silicon nitride material film. A desirable density of the silicon nitride material is 2.3-3.05 gr/cm$^3$ and the most effective density is the highest possible density that does not exceed 3.05 gr/cm$^3$. A silicon nitride material film having a density higher than 3.1 gr/cm$^3$ is undesirable in that it has tensile internal stresses due to which cracks appear at the deposition of the film. A silicon nitride material film having a density lower than 2.3 gr/cm$^3$ is unfavorable in that the mechanical characteristics are unsatisfactory, so cracks are liable to occur due to external stresses. Since the mechanical characteristics are enhanced with increase in the density, the highest possible density within the range which does not exceed 3.05 gr/cm$^3$ is desirable. The density of the film of silicon nitride material is dependent upon, for example, the substrate temperature at the deposition, and it increases substantially rectilinearly with rise in the substrate temperature. In order to attain the aforecited density range, the substrate temperature needs to be made from 120° C.-600° C. At a substrate temperature of 270° C., the density becomes 2.5±0.1 gr/cm$^3$. Besides, the density is increased by a decrease in the pressure of a reaction gas and rise in the frequency of an r.f. voltage.

It is desirable that the thickness of the passivation layer made of the silicon nitride material is 0.7-2.3 μm. When the thickness falls outside this range, unfavorably the mechanical characteristics of the silicon nitride material film are lower, so the film is liable to undergo cracks due to external stresses. A more preferable thickness is 1.0-2.2 μm, and the most preferable thickness is 1.2-2.0 μm.

The semiconductor body in the semiconductor device of this invention shall have at least one circuit element. The circuit element is usually disposed in a surface portion of a semiconductor wafer. The semiconductor body shall include insulating films, bonding pads and an interconnecting conductor layer which are disposed on the semiconductor wafer as may be needed. In particular, as an effective example of the invention, there can be mentioned a semiconductor body comprising a silicon dioxide film which is disposed on a semiconductor wafer and which has openings at predetermined positions, an inorganic insulating film of phosphosilicate glass or silicon nitride which is disposed on the silicon dioxide film by the pyrolytic chemical vapor deposition known well and which has openings at predetermined positions, and an interconnecting conductor layer of predetermined pattern which extends on the inorganic insulating film and which connects with predetermined regions in the wafer via the openings of the inorganic insulating film and the openings of the silicon dioxide film.

A semiconductor device wherein, on such semiconductor body, a passivation layer which is made of the film of the silicon nitride material of this invention and which has openings at predetermined positions is formed, and a metal layer of predetermined pattern which extends on the passivation layer and which connects with the interconnecting conductor layer via the openings is disposed, can be mentioned as an effective concrete example of the semiconductor device according to this invention. In this case, the passivation layer may well be a double film in which a resin film is further disposed on the silicon nitride material film. This resin may be any of a PIQ resin ("PIQ" is a registered trademark of Hitachi Kasei Kabushiki-Kaisha in Japan, and the designation of the substance is polyimide-isoindroquinazolinedione), a polyimide resin and a polyamide resin. The aforecited metal layer can be employed both as an interconnection layer and as a bonding pad. In case of employing it as the bonding pad, a bonding portion can be arranged above or over the active region of the semiconductor wafer, and hence, the designs of the semiconductor devices such as ICs can be made multifarious and easy. This is because the silicon nitride material film for use in the semiconductor device according to the present invention is excellent in the mechanical characteristics and is hard to undergo cracks.

In many cases, the semiconductor wafer is principally composed of Si. It is desirable that the phosphorus content of the phosphosilicate glass for the inorganic insulating film is 3-6 mol-%. When the phosphorus content exceeds 6 mol-%, the silicon nitride material film disposed on the phosphosilicate glass film tends to exfoliate in the pressure cooker test, and corrosion takes place in the Al interconnection, so that any favorable result cannot be expected. In case where the phosphorus content falls short of 3 mol-%, unfavorably the gettering action for Na is weak as is well known.

BRIEF DESCRIPTION OF THE DRAWINGS

FIG. 5 is a graph showing the relationship between the Si content as well as the N content in a silicon nitride material film and the mechanical strength of the film;

FIG. 7 is a graph showing the relationship between the thickness of a silicon nitride material film and the mechanical strength thereof.

DETAILED DESCRIPTION OF THE PRESENTLY PREFERRED EMBODIMENTS

Embodiment 1

Figure 1:
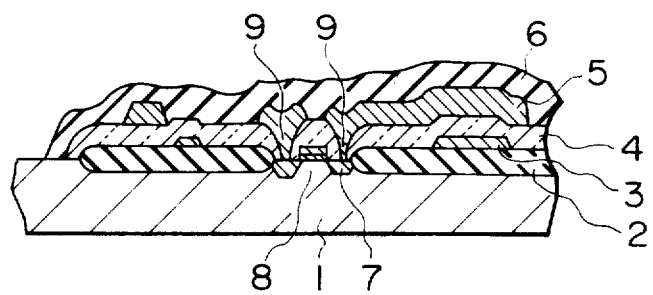
FIG. 1 is a sectional view of a semiconductor device in an embodiment of this invention.

FIG. 1 shows a sectional view of a semiconductor device fabricated in this embodiment (a package being omitted from the illustration).

A silicon dioxide film 2 having an opening 8 was disposed on a silicon wafer 1, a polycrystalline silicon film 3 was arranged on predetermined parts of the silicon dioxide film 2, and a film 4 of phosphosilicate glass (phosphorus content: approximately 4.5 mol-%) having openings 9 was deposited on the silicon dioxide film 2 and the polycrystalline silicon film 3. An Al interconnection layer 5 was formed so as to extend on the phosphosilicate glass film 4 and to connect with diffusion layers 7 in the silicon wafer 1 via the openings 9 of the phosphosilicate glass film 3 and the opening 8 of the silicon dioxide film 2. An end part of the phosphosilicate glass film 3 was held in direct contact with the silicon wafer 1. The above various steps of manufacture were readily carried out with methods well known in the field of semiconductor industries.

On the whole surfaces of semiconductor bodies thus prepared, silicon nitride material films 6 of various H contents were deposited to thicknesses of about 2 μm. A plasma CVD equipment which had capacitively-coupled electrodes in the shape of discs being 64 cm in diameter was used for the formation of the silicon nitride material film 6. Standard forming conditions of the film of the silicon nitride material were as follows.

The flow rates of reaction gases were 2.1 cm$^3$/sec for SiH$_4$, 5.0 cm$^3$/sec for NH$_3$ and 10.0 cm$^3$/sec for N$_2$. The reaction gas pressure was 35 Pa. The radio-frequency voltage applied had a frequency of 50 KHz and a radio-frequency power of 0.42 KW. The silicon body temperature at the deposition of the silicon nitride material was 270° C. The film layer of silicon nitride material deposited by the plasma CVD under the standard forming conditions was composed of 67.8 weight-% of Si, 28.6 weight-% of N, 3.4 weight-% of H and 0.23 weight-% of O. The H content was controlled by the body temperature, the frequency of the r.f. voltage and the reaction gas pressure. This H content lowered on the basis of rise in the body temperature, rises in the frequency of the r.f. voltage, or decrease in the reaction gas pressure.

In case where the H content was below 0.8 weight-%, cracks appeared in the silicon nitride material film 6 already in the deposition process. In case where the silicon nitride material film contained H in excess of 5.9 weight-%, bulges and cracks appeared in the silicon nitride material film when the silicon body was heated in a subsequent step. Accordingly, the H content of the film of the silicon nitride material needs to be 0.8-5.9 weight-%. In case where the H content of this film was 0.8-5.9 weight-%, the semiconductor device in the present embodiment demonstrated as extraordinarily favorable result and sustained a stable state even after it was packaged with a mold resin.

The atmosphere gas in the plasma CVD may well contain an inert gas such as Ar and He, O$_2$, NO$_2$, etc., in addition to the aforecited ingredients.

Now, a method of analyzing H in the film of silicon nitride material will be explained. Silicon nitride material was deposited by the plasma CVD directly on a silicon wafer similar to that employed for the foregoing semiconductor body, and the quantity of H$_2$ gas emitted when the resultant silicon wafer was heated up to 1,200° C. was measured by means of a mass spectrometer. Conditions for depositing the silicon nitride material were quite the same as in the case of manufacturing the semiconductor device illustrated in FIG. 1. Methods of analyzing Si, N and O will be explained in an embodiment to be stated later.

Figure 2:
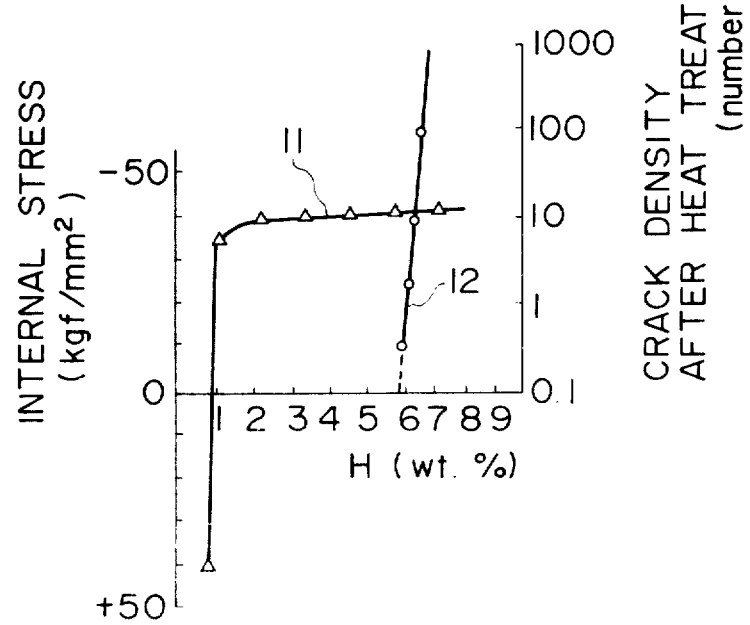
FIG. 2 is a graph showing the relationship between the H content in a silicon nitride material film and the internal stress of the film as well as the crack density after a heat treatment.

FIG. 2 illustrates the relationship between the H content in the film of the silicon nitride material and the internal stress of the film as well as the crack density after the heat treatment. In FIG. 2, a curve 11 indicates the internal stress, and a curve 12 the crack density.

The internal stress of the film was calculated from a change in the radius of curvature of an Si wafer after depositing silicon nitride material directly on the wafer under the same conditions as described previously. The measurement of the radius of curvature was resorted to the Newton ring method.

The crack density was measured after the semiconductor body with the silicon nitride material deposited thereon had been heated at 450° C. for 30 minutes.

As apparent from FIG. 2, in case where the H content in the deposited film of the silicon-nitride material is below 0.8 weight-%, the film has a tensile internal stress. Under this condition, cracks already appear upon depositing the film to a thickness of 0.3-0.7 μm, and it is difficult to deposit the film to a greater thickness. In case where the content of H is above 5.9 weight-%, the crack density measured after the heat treatment is conspicuously high. Accordingly, it ought to be avoided that the H content in the film is below 0.8 weight-% and that it is above 5.9 weight-%. Since this point was unknown before, it was difficult to produce at a high available percentage a semiconductor device of excellent characteristics employing a film of silicon nitride material as a passivation layer.

As temperature increasing processes after the formation of the film of the silicon nitride material, there are annealing (for about 30 minutes at 400–450° C.) and plastic encapsulation at 350–490° C.

Embodiment 2

Likewise to Embodiment 1, a film of silicon nitride material was deposited as a passivation layer onto the whole surface of a semiconductor body which had a silicon dioxide film, a polycrystalline silicon film, a phosphosilicate glass layer and an Al interconnection layer. The thickness of the silicon nitride material film was made 2 μm, the H content was made approximately 1.8 weight-%, and the O content was made 0.23-0.35 weight-%. Further, in the present embodiment, the Si content and the N content of the film of silicon nitride material to be deposited were varied. The Si content of the N content could be controlled by varying the ratio between the quantity of SiH$_4$ and the quantity of NH$_3$ of the reaction gas in the plasma CVD. By increasing the quantity of NH$_3$ relatively, the N content in the silicon nitride film increased.

The semiconductor body formed with the silicon nitride material film as the passivation layer was plastic-encapsulated (resin-molded) with an epoxy resin. The maximum heating temperature in the encapsulation was approximately 400° C.

In case where the Si content in the silicon nitride film was 61-70 weight-% and where the N content was 25-37 weight-%, favorable results were obtained without the appearance of cracks due to the encapsulation. Even after a bias voltage of 20 V was applied for 1,000 hours in an atmosphere of a temperature of 85° C. and a humidity of 85%, the failure percentage did not get at 0.1%.

However, when the Si content and the N content fell outside the aforecited range, the semiconductor device after the plastic encapsulation was low in reliability. When a test was conducted in which the bias voltage of 20 V was applied for 1,000 hours in the atmosphere of a temperature of 85° C. and a humidity of 85%, the failure percentage became above 0.1%. A high reliability equivalent to that of ceramic-encapsulated devices is required of ICs etc. for computers and car electronics, and the failure percentage must be at most 0.1%. It is accordingly desirable that the Si content and the N content in the silicon nitride material used as the passivation layer lie within the above-mentioned range. The failure percentage of 0.1% in this case corresponds to a defect density of approximately 1 defect/chip in the silicon nitride film after the plastic encapsulation. The size of one chip is 6.1 mm×6.2 mm.

Figure 3:
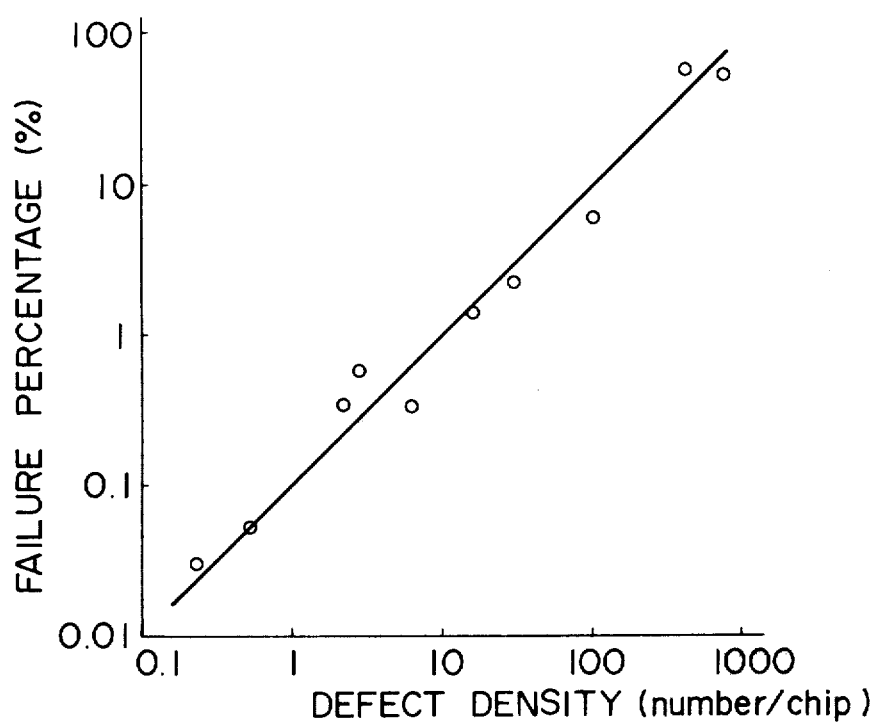
FIG. 3 is a graph showing the relationship between the defect density of a film of the silicon nitride material and the failure percentage of a semiconductor device.

FIG. 3 is a graph which illustrates the relationship between the number of defects of the passivation layer per chip after the plastic encapsulation and the failure percentage after the test. As apparent from FIG. 3, in order to make the failure percentage at most 0.1%, the defect density of the silicon nitride material after the plastic encapsulation must be made at most 1 defect/chip. Accordingly, the mechanical strength of the silicon nitride material to be deposited on the semiconductor body as a film or layer must be high against the compressive stress of the resin after the plastic encapsulation to the extent that only at most one crack per chip appears.

As a scale indicative of the mechanical strength of the film of the silicon nitride material, the inventors have judged it suitable to employ a value Ud which is the product between the deformation energy till the breaking of the film and the film thickness t. The "deformation energy till the breaking" signifies the product between the "breaking stress" and the "breaking strain." Since, however, it is difficult to directly measure the breaking stress of a thin film, the hardness is used as a value to substitute therefor.

Regarding the measurement of the hardness of the film of the silicon nitride material, the hardness Hv of this film deposited directly on a silicon wafer by the plasma CVD was measured by means of a Vickers' hardness meter. Regarding the measurement of the breaking strain of the film of the silicon nitride material, silicon nitride material was deposited directly on an Al sheet of a thickness of 0.5 mm by the plasma CVD, it was pulled by means of a Tensilon tensile tester until a crack appeared in the film, and an elongation necessary for causing the crack in the film was evaluated. The breaking strain $\xi_B$ is denoted by $$\xi_B = \frac{\Delta L}{L}.$$

$\Delta L$ denotes a tensile elongation at which the breaking occurs, and L the length of the sample pulled. In both the cases of the hardness measurement and the breaking strain measurement, conditions for depositing the silicon nitride material were the same as in the manufacture of the foregoing semiconductor device in the present embodiment.

Figure 4:
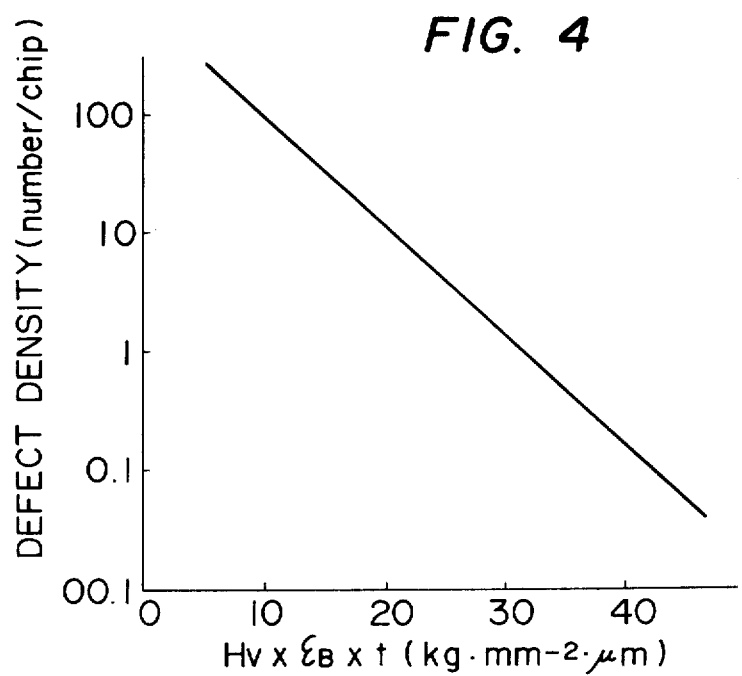
FIG. 4 is a graph showing the relationship between the mechanical strength of a film of the silicon nitride material and the defect density.

The strength Ud of the film of the silicon nitride material is indicated by $Ud = Hv \times \xi_B \times t$. FIG. 4 is a graph which illustrates the relationship between the number of defects of the passivation layer per chip after the plastic encapsulation and the value Ud or $Hv \times \xi_B \times t$. Here, the unit of Hv is $Kg/mm^2$, $\xi_B$ is $\Delta L/L$ which is dimensionless, the unit of t is $\mu m$, and the unit of Ud is expressed by $Kg \cdot mm^{-2} \cdot \mu m$ in substance. As stated previously, the defect density of the film of silicon nitride material after the plastic encapsulation must be at most 1 defect/chip. From the relationship of FIG. 4, accordingly, $Hv \times \xi_B \times t$ must be greater than about 30 $kg \cdot mm^{-2} \cdot \mu m$. The size of the chip in FIGS. 3 and 4 is 6.1 mm × 6.2 mm.

When the relationship between the Si content and N content in the film or layer of the silicon nitride material formed by the plasma CVD and the value of $Hv \times \xi_B \times t$ is illustrated, FIG. 5 is obtained. As seen from FIG. 5, the Si content and N content in the film need to lie in ranges of 61–70 weight-% and 25–37 weight-%, respectively, in order that the value of $Hv \times \xi_B \times t$ which is the scale indicative of the mechanical strength of the film may become greater than about 30 $Kg \cdot mm^{-2} \cdot \mu m$. As apparent from the previous description, accordingly, the Si content and N content in the silicon nitride material serving as the passivation layer are required to lie in the ranges of 61–70 weight-% and 25–37 weight-%, respectively, in order to attain by the plastic encapsulation the semiconductor device which has the reliability as high as in the ceramic-encapsulated device. This agrees well with a result which was obtained in a reliability test with the foregoing semiconductor body in the present embodiment. It is understood from FIG. 5 that more preferable ranges of the Si content and N content are 63–68.5 weight-% and 27–34 weight-% respectively and that the most preferable ranges thereof are 64–67.5 weight-% and 28–32 weight-% respectively.

The analyses of Si and N in the film of the silicon nitride material resorted to the ESCA. The ESCA is a technique wherein a sample is irradiated by monochromatic soft X-rays and wherein elements are analyzed by the energy analysis of photoelectrons emitted, and it is well known in the field of analytical technologies. Necessary constants were determined by employing stoichiometric silicon nitride ($Si_3N_4$) as a reference sample.

As regards the analysis of O, the silicon nitride material was deposited as a film directly on an Si wafer by the plasma CVD under quite the same conditions as in case of preparing the other samples. Thereafter, the well-known activation analysis was resorted to wherein the silicon nitride film was irradiated by $He^3$ (accelerated to approximately 32.5 MeV by a cyclotron), to turn O in the film into $F^{18}$, and the quantity by which $F^{18}$ was converted into $O^{18}$ was counted.

The analysis of H was as stated in Embodiment 1.

Embodiment 3:

Likewise to Embodiment 2, a film of a silicon nitride material was deposited on the whole surface of a semiconductor body as a passivation layer. Thereafter, the resultant semiconductor body was encapsulated with an epoxy resin, and a bias voltage of 20 V was applied thereto in an atmosphere of a temperature of 85° C. and a humidity of 85% for 1,000 hours. The H content in the film was made about 1.8 weight-%, the Si content was made about 65 weight-%, the N content was made about 33 weight-%, and the O content was varied in a range not exceeding 0.9 weight-%. The O content could be controlled depending upon the semiconductor body temperature on which the film was deposited, and it decreased with rise in the body temperature.

In case where the O content in the film was not higher than 0.6 weight-%, the failure percentage after the test was at most 0.1%, and good results were produced. In contrast, when the O content exceeded 0.6 weight-%, the failure percentage was greater than 0.1%, and undesirable results were obtained.

The reason will be that, upon the increase of the O content, the hardness Hv of the film of the silicon nitride material lowers, so the value $Hv \times \xi_B \times t$ indicative of the strength of the film decreases. Methods for analyzing the composition were as described in Embodiments 1 and 2.

Embodiment 4:

Likewise to Embodiment 2, a film of the silicon nitride material was deposited on the whole surface of a semiconductor body as a passivation layer. Thereafter, the resultant semiconductor body was encapsulated with an epoxy resin, and a bias voltage of 20 V was applied thereto in an atmosphere of a temperature of 85° C. and a humidity of 85% for 1,000 hours. Then the failure percentage was investigated. The composition of the silicon nitride material in the film consisted of 66–68 weight-% of Si, 31-33 weight-% of N and about 1.8 weight-% of H. The thickness of the film was made about 2 μm. In the present embodiment, the density of the film was varied by varying the body temperature at the deposition of the silicon nitride material, etc.

As a result, in case where the density of the film was 2.3–3.05 gr/cm$^3$, the failure percentage was not higher than 0.1%. On the other hand, in case where the density was below 2.3 gr/cm$^3$, unfavorably the failure percentage based on the test exceeded 0.1%. When the density exceeded about 3.1 gr/cm$^3$, cracks appeared already in the process of depositing the film, and hence, such high densities ought to be avoided. Accordingly, the appropriate density of the film of the silicon nitride material is 2.3–3.05 gr/cm$^3$.

Figure 6:
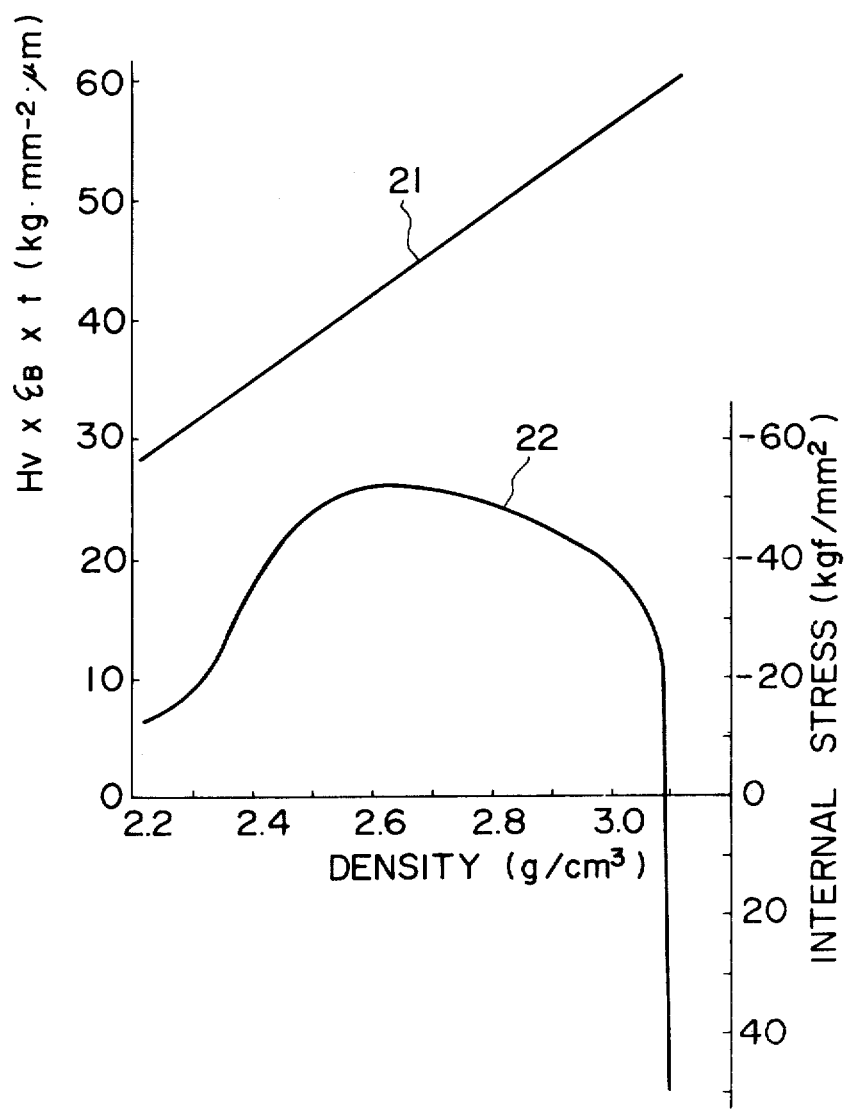
FIG. 6 is a graph showing the relationship between the density of a silicon nitride material film and the mechanical strength of the film as well as the internal stress thereof.

FIG. 6 is a graph which illustrates the relationship between the density of the film of the silicon nitride material and the internal stress as well as $Hv \times \xi_B \times t$. A straight line 21 indicates the value $Hv \times \xi_B \times t$, and a curve 22 indicates the internal stress.

The density of the film was evaluated from the weight of the film obtained from the measurement of a weight change before and after the formation of the film, and the volume of the film calculated from the thickness of the film and the area of the deposition wafer. Methods for analyzing the composition, a method for measuring $Hv \times \xi_B \times t$ and a method for measuring the internal stress were the same as already stated in the foregoing embodiments.

As apparent from FIG. 6, when the density is below 2.3 gr/cm$^3$, the value $Hv \times \xi_B \times t$ indicative of the strength of the film is less than about 30 Kg·mm$^{-2}$·μm, and the strength of the film is unsatisfactory. When the density exceeds about 3.1 gr/cm$^3$, the film comes to have a tensile internal stress, and the number of appearing cracks is large, so that the density values ought to be avoided. These agree well with the test results. Since $Hv \times \xi_B \times t$ increases rectilinearly with increase in the density, the highest possible density that does not exceed 3.05 gr/cm$^3$ is desirable.

The density of the film deposited by the plasma CVD varies depending upon the body temperature at the deposition, the frequency of the r.f. voltage, and the reaction gas pressure. It increases upon the rise of the body temperature or the frequency of the r.f. voltage or the decrease of the reaction gas pressure. Ordinarily, body temperatures suitable for establishing densities of 2.3–3.05 gr/cm$^3$ are 120°–600° C.

Embodiment 5:

Likewise to Embodiment 2, a film of the silicon nitride material was deposited on the whole surface of a semiconductor body as a passivation layer. Thereafter, the resultant semiconductor body was encapsulated with an epoxy resin, and a bias voltage of 20 V was applied thereto in an atmosphere of a temperature of 85° C. and a humidity of 85% for 1,000 hours. Then, the failure percentage was studied. The composition of the silicon nitride material forming the film consisted of 67 weight-% of Si, 31 weight-% of N, 1.8 weight-% of H and 0.2 weight-% of O, and the density thereof was 2.88 gr/cm$^3$. In the present embodiment, the thickness of the film was varied in a range of 0.3 μm–2.5 μm, and the influence of the film thickness was studied.

As a result, in case where the thickness of the film was 0.7–2.3 μm, the failure percentage was found at most 0.1% by the test. However, in case where the thickness fell short of 0.7 μm and in case where it was in excess of 2.3 μm, the failure percentage exceeded 0.1%.

It can accordingly be said that appropriate thicknesses of the film of the silicon nitride material used as a passivation layer are 0.7–2.3 μm.

FIG. 7 is a graph which illustrates the relationship between the thickness of a film of the silicon nitride material of this invention and the magnitude $Hv \times \xi_B \times t$. In FIG. 7, (i) a curve 31 corresponds to a case where the composition consisted of 67 weight-% of Si, 31 weight-% of N, 1.8 weight-% of H and 0.2 weight-% of O and where the density was 2.9 gr/cm$^3$; (ii) a curve 32 corresponds to a case where the composition consisted of 67 weight-% of Si, 31 weight-% of N, 1.7 weight-% of H and 0.3 weight-% of O and where the density was 2.7 gr/cm$^3$; (iii) a curve 33 corresponds to a case where the composition consisted of 68 weight-% of Si, 29 weight-% of N, 1.8 weight-% of H and 0.2 weight-% of O and where the density was 2.7 gr/cm$^3$; and (iv) a curve 34 corresponds to a case where the composition consisted of 69 weight-% of Si, 28 weight-% of N, 1.8 weight-% of H and 0.2 weight-% of O and where the density was 2.6 gr/cm$^3$. In the case of the curve 31 in which the magnitude $Hv \times \xi_B \times t$ is comparatively great, it is with the film of a thickness of 0.7 μm–2.3 μm that the magnitude $Hv \times \xi_B \times t$ becomes 30 Kg·mm$^{-2}$·μm or greater. When the film thickness lies outside this range, the magnitude $Hv \times \xi_B \times t$ does not get at 30 Kg·mm$^{-2}$·μm, and no satisfactory strength can be expected. This agrees well with the test result. A method for measuring $Hv \times \xi_B \times t$ was the same as in Embodiment 2.

It is seen from FIG. 7 that thicknesses of the film of the silicon nitride material exhibiting more excellent strengths are 1.0 μm–2.2 μm and that thicknesses bringing forth the most favorable results are 1.2 μm–2.0 μm.

Figure 8:
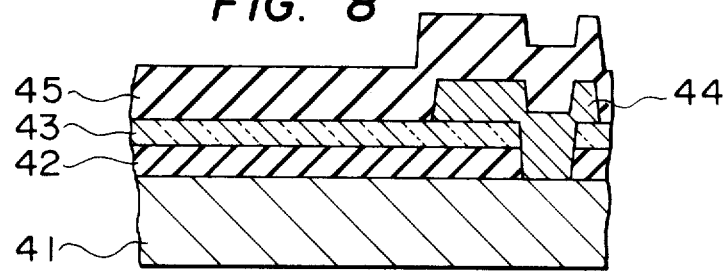
FIGS. 8, 9 and 10 are sectional views each showing a semiconductor device in another embodiment of this invention.

Embodiment 6:

A semiconductor device of a sectional structure shown in FIG. 8 was manufactured in the same way as in Embodiment 1. In the figure, numeral 41 designates a silicon wafer, numeral 42 a silicon dioxide film, numeral 43 a phosphosilicate glass film, numeral 44 an Al interconnection layer, and numeral 45 a film of the silicon nitride material. A diffusion region disposed within the silicon wafer is omitted from the illustration.

The phosphosilicate glass film 43 was deposited to a thickness of about 0.7 μm by the CVD. The phosphorus concentration in the phosphosilicate glass film 43 was made 1–12 mol-%.

Such semiconductor devices were subjected to PCTs (pressure cooker tests: tests in water vapor at 120° C. under 2 atmospheres) for 100 hours. Then, results as listed in Table 1 were obtained. When the phosphorus concentration in the phosphosilicate glass film 43 became 8.0 mol-% or higher, the film of the silicon nitride material 45 overlying the phosphosilicate glass film 43 exfoliated. In contrast, in case where the phosphorus concentration was 6 mol-% or lower, the exfoliation of the film of the silicon nitride material did not take place.

TABLE 1

| Concentration of phosphorus in phosphosilicate glass (mol · %) | Presence or absence of exfoliation of the silicon nitride material film after PCT for 100 hours |
|---|---|
| 1.0 | Without exfoliation |
| 3.0 | Without exfoliation |
| 4.5 | Without exfoliation |
| 6.0 | Without exfoliation |
| 8.0 | With exfoliation |
| 10.3 | With exfoliation |

TABLE 1-continued

| Concentration of phosphorus in phosphosilicate glass (mol - %) | Presence or absence of exfoliation of the silicon nitride material film after PCT for 100 hours |
|---|---|
| 12.0 | With exfoliation |

Similar results were obtained even when the surface of the silicon dioxide 42 treated with POCl$_3$-gas, etc. into phosphosilicate glass was used as the phosphosilicate glass film without resorting to the CVD.

Figure 9:
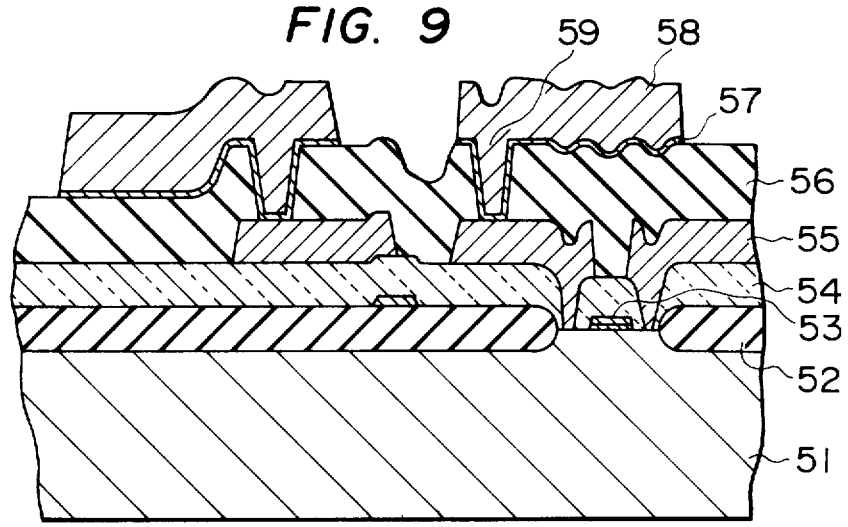

Embodiment 7:

FIG. 9 shows a sectional view of a semiconductor device fabricated in the present embodiment (a package and diffusion regions in a silicon wafer are not shown).

A silicon dioxide film 52 having an opening portion was disposed on a silicon wafer 51, a polycrystalline silicon film 53 was arranged on predetermined parts of the silicon dioxide film 52, and a phosphosilicate glass (phosphorus content: approximately 4.5 mol-%) film 54 having openings was deposited on the silicon dioxide film 52 and the polycrystalline silicon film 53. An Al (which may contain some alloy element) interconnection layer 55 of predetermined pattern was formed so as to extend on the phosphosilicate glass film 54 and to connect with diffusion regions in the silicon wafer 51 via the openings of the phosphosilicate glass film 54 and the silicon dioxide film 52. End parts of the phosphosilicate glass film 54 lay in direct contact with the silicon wafer 51.

On the whole surface of a semiconductor body thus prepared, a film 56 of the silicon nitride material which was about 1.8 μm thick was deposited by the plasma CVD under the same standard forming conditions as indicated in Embodiment 1. Further, the film 56 was provided with openings 59 by the well-known plasma etching. Subsequently, an Ni—Cr alloy film 57 of predetermined pattern was deposited, and an Au layer 58 serving as a second conductor layer was provided thereon. The Ni—Cr alloy film 57 and the Au layer 58 may well be replaced with an Al layer or Al alloy layer as the second conductor layer.

The second conductor layer can also be arranged over an active region of an IC or the like as a bonding pad. This has become possible since the film of the silicon nitride material for use in the semiconductor device of this invention is excellent in the crack-resistance even against a bonding stress, and increases the versatility of the design.

The phosphosilicate glass film 54 may well be substituted by a silicon nitride film. The silicon nitride film 56 may well be stacked on a silicon dioxide film or phosphosilicate glass film being 0.1–0.5 μm, and the excellent characteristics of this silicon nitride film are not spoiled by the stacking. As is well known, the Ni—Cr alloy film 57 may well be a double layer consisting of an Ni—Cr alloy film and a Pd film, a double layer consisting of a Ti film and a W film, or a double layer consisting of a Ti film and a Pd film. When Au is employed for the second conductor layer as in the present embodiment, the bonding property is excellent for the Au nail head thermocompression bonding or the tape carrier bonding. Accordingly, the bonding force and the bonding temperature may be low, and the bonding period of time may be short. Moreover, the corrosion-resistance is excellent, the current density can be raised, and the reliability is high. The Au layer 58 can also be employed for an interconnection layer. When a metal other than Au, for example, Al is employed for the second conductor layer, the Ni—Cr alloy film 57 is unnecessary.

The film 56 is good in the mechanical strength as already stated, and does not undergo any crack due to an impact attendant upon the wire bonding. Even when the semiconductor device with the silicon nitride film is plastic-encapsulated, no crack appears.

The semiconductor device described in the present embodiment is applicable to a MOS or bipolar IC (in case of the bipolar IC, the polycrystalline silicon film 53 is not formed, and the phosphosilicate glass film 54 is sometimes replaced with the silicon dioxide film 52 subjected to a treatment with phosphorus).

Figure 10:
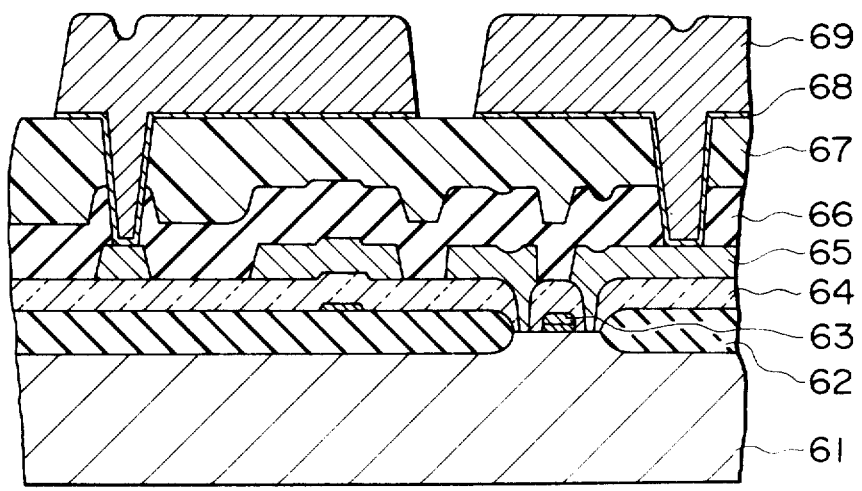

Embodiment 8:

FIG. 10 shows a sectional view of a semiconductor device fabricated in the present embodiment (a package and diffusion regions in a silicon wafer are not shown). This semiconductor device is such that a polyimide resin film 67 is added to the semiconductor device of Embodiment 7 illustrated in FIG. 9. The polyimide resin film 67 overlies a film 66 of the silicon nitride material of this invention, and it may be substituted by a polyamide resin film or a PIQ resin ("PIQ" being a registered trademark of Hitachi Kasei Kabushiki-Kaisha in Japan) film. The PIQ resin is a thermosetting resin which has the substance designation of polyimide-iso-indroquinazolinedione.

Referring to FIG. 10, numeral 61 indicates a silicon wafer, numeral 62 a silicon dioxide film, numeral 63 a polycrystalline silicon film, numeral 64 a phosphosilicate glass (phosphorus content: approximately 4.5 mol-%) film, numeral 65 an Al interconnection layer, numeral 66 the silicon nitride material film, numeral 67 the polyimide film, numeral 68 an Ni—Cr alloy film, and numeral 69 an Au layer.

The semiconductor device according to the present embodiment employs the double film which consists of the silicon nitride film material 66 being excellent in the mechanical strength and less liable to cracks and the resin film 67 having a high mechanical ductility. Thus, it can moderate an impact in the case where a wire is bonded to the second conductor layer (the Au layer 69 in the present embodiment) being the bonding pad. For this reason, the bonding pad can be arranged over the active element region of an IC pellet more stably than in Embodiment 7.

The second conductor layer can employ an Al layer or an Al alloy layer otherwise than the Au layer 69. In this case, the Ni—Cr alloy film 68 is unnecessary. The Ni-Cr alloy film underlying the Au layer 69 may well be the double layer described in Embodiment 7.

Obviously many modifications and variations of the present invention are possible in the light of the above teachings. It is, therefore, to be understood that within the scope of the appended claims the invention may be practiced otherwise than as specifically described.

What is claimed is:

1. A semiconductor device comprising a passivation layer which is disposed on a semiconductor body having at least one circuit element therein and which is made of a silicon nitride material consisting essentially of 61–70 weight-% of Si, 25–37 weight-% of N, 0.8–5.9 weight-% of H and up to 0.6 weight-% of O and having a density of 2.9–3.05 gr/cm$^3$, wherein said semiconductor body includes a silicon dioxide film which is disposed on a semiconductor wafer and which has an opening at a predetermined position, an inorganic insulating film of phosphosilicate glass or the silicon nitride material which is disposed on said silicon dioxide film and which has openings at predetermined positions, and an interconnecting conductor layer of predetermined pattern which extends on said inorganic insulating film and which connects with predetermined regions in said wafer via said openings of said inorganic insulating film and said opening of said silicon dioxide film, wherein said passivation layer has a metal layer of predetermined pattern which extends on said passivation layer and which connects with said interconnecting conductor layer via an opening existent at a predetermined position of said passivation layer, and wherein said metal layer is extended over an active region of said semiconductor wafer and is used as a bonding pad.

2. A semiconductor device comprising a passivation layer which is disposed on a semiconductor body having at least one circuit element therein and which is made of a silicon nitride material consisting essentially of 61–70 weight-% of Si, 25–37 weight-% of N, 0.8–5.9 weight-% of H and up to 0.6 weight-% of O and having a density of 2.9–3.05 gr/cm$^3$, wherein said semiconductor body includes a silicon dioxide film which is disposed on a semiconductor wafer and which has an opening at a predetermined position, an inorganic insulating film of phosphosilicate glass or the silicon nitride material which is disposed on said silicon dioxide film and which has openings at predetermined positions, and an interconnecting conductor layer of predetermined pattern which extends on said inorganic insulating film and which connects with predetermined regions in said wafer via said openings of said inorganic insulating film and said opening of said silicon dioxide film, said passivation layer having on its surface a film of one resin selected from the group consisting of a PIQ resin, a polyimide resin and a polyamide resin, the resin film having a metal layer of predetermined pattern which extends on said resin film and which connects with said interconnecting conductor layer via an opening existent at a predetermined position of said passivation layer including said resin film, and said metal layer extending over an active region of said semiconductor wafer and providing a bonding pad.

3. A semiconductor device according to claim 1 or claim 2, wherein said passivation layer has a thickness of 0.7–2.3 μm.

4. A semiconductor device according to claim 1 or claim 2, wherein said semiconductor body has a polycrystalline silicon film covering said inorganic insulating film, on a part of said silicon dioxide film.

5. A semiconductor device according to claim 1 or claim 2, wherein said phosphosilicate glass contains 3–6 mol-% of phosphorus.

* * * * *